United States Patent
Shen et al.

(10) Patent No.: US 9,402,470 B2
(45) Date of Patent: Aug. 2, 2016

(54) RACK MOUNTING KIT FOR TELECOMMUNICATIONS EQUIPMENT AND RACK CROSS BRACE

(71) Applicant: Cisco Technology, Inc., San Jose, CA (US)

(72) Inventors: Lin Shen, Saratoga, CA (US); Stephen Ong, Fremont, CA (US); Mark Siechen, Scotts Valley, CA (US); Timothy Lee, San Mateo, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/468,625

(22) Filed: Aug. 26, 2014

(65) Prior Publication Data

US 2015/0122752 A1    May 7, 2015

Related U.S. Application Data

(60) Provisional application No. 61/900,338, filed on Nov. 5, 2013.

(51) Int. Cl.
*H05K 7/14*       (2006.01)
*A47B 45/00*    (2006.01)
*A47B 96/00*    (2006.01)
*A47B 97/00*    (2006.01)

(52) U.S. Cl.
CPC .................. *A47B 45/00* (2013.01); *A47B 96/00* (2013.01); *A47B 97/00* (2013.01); *H05K 7/1488* (2013.01); *H05K 7/1489* (2013.01); *Y10T 29/49826* (2015.01); *Y10T 29/49963* (2015.01)

(58) Field of Classification Search
CPC ........ A47B 45/00; A47B 96/00; A47B 97/00; H05K 7/1488; H05K 7/1489; H05K 7/183
USPC ......................................... 211/26; 312/223.2
See application file for complete search history.

(56) References Cited

U.S. PATENT DOCUMENTS

| | | | | |
|---|---|---|---|---|
| 6,095,345 A * | 8/2000 | Gibbons | .......................... | 211/26 |
| 8,295,044 B2 * | 10/2012 | Chen et al. | ............... | 361/679.33 |
| 8,371,454 B2 * | 2/2013 | Chen et al. | ....................... | 211/26 |
| 8,562,086 B1 * | 10/2013 | Baik et al. | ................... | 312/334.4 |
| 8,701,902 B2 * | 4/2014 | Oura | .............................. | 211/192 |
| 2002/0084734 A1 * | 7/2002 | Shih | ........................... | 312/334.4 |
| 2005/0145582 A1 * | 7/2005 | Dubon et al. | .................... | 211/26 |
| 2006/0065164 A1 * | 3/2006 | Baez | ................................ | 108/42 |
| 2006/0157436 A1 * | 7/2006 | Iwamoto | ........................ | 211/191 |
| 2007/0175835 A1 | 8/2007 | Liang et al. | | |

(Continued)

OTHER PUBLICATIONS

Invitation to Pay Additional Fees and, Where Applicable, Protest Fee for International Application No. PCT/US2014/062998, mailed Mar. 4, 2015.

*Primary Examiner* — Joshua Rodden
(74) *Attorney, Agent, or Firm* — Polsinelli PC

(57) ABSTRACT

A rack mounting kit is configured to allow mounting of a telecommunications equipment chassis into a rack by a single person. The rack mounting kit includes two complimentary brackets that form a shelf-like feature. The complimentary brackets also include a mating latch for interfacing with a chassis to secure the chassis in place. Additionally, a cross brace is provided that is removably installed onto the two complimentary brackets to provide additionally rigidity to a rack while a chassis is being installed. The cross brace can be removed once installation of the chassis is complete.

17 Claims, 6 Drawing Sheets

(56) References Cited

U.S. PATENT DOCUMENTS

| | | | |
|---|---|---|---|
| 2009/0101603 A1* | 4/2009 | Hilburn et al. | 211/26 |
| 2011/0058339 A1 | 3/2011 | Le et al. | |
| 2011/0278250 A1 | 11/2011 | Malekmadani | |
| 2011/0290746 A1* | 12/2011 | Lu | 211/26 |
| 2012/0068031 A1 | 3/2012 | Phelan et al. | |
| 2012/0106079 A1* | 5/2012 | Gomez | 361/679.58 |
| 2012/0161599 A1* | 6/2012 | Chen et al. | 312/333 |
| 2012/0212893 A1* | 8/2012 | Furuta | 361/679.02 |
| 2013/0048581 A1* | 2/2013 | Kuo | 211/26 |

* cited by examiner

US 9,402,470 B2

RACK MOUNTING KIT FOR TELECOMMUNICATIONS EQUIPMENT AND RACK CROSS BRACE

CROSS REFERENCE TO RELATED APPLICATIONS

This application claims the benefit of U.S. Provisional Application No. 61/900,338, filed Nov. 5, 2013, which is incorporated herein by reference in its entirety.

TECHNICAL FIELD

The present technology generally relates racks for telecommunications equipment; and more specifically relates to a rack mounting kit for mounting a switch chassis.

BACKGROUND

Information technology and telecommunications equipment ("IT and telecom equipment") is typically stored on equipment racks ("racks"). These racks offer flexibility of positioning, allow appropriate spacing, and allow for a clean installation for access to add, remove, repair, or replace equipment. Traditional rack mount kits generally require more than one person to safely and reliably install telecommunications equipment into a rack. The device chassis that compose this IT and telecom equipment are often heavy and of a large size, making it difficult for a single person to safely hold the device chassis steady while attaching the equipment to the rack.

While one might be tempted to look at racks that are designed and used for other purposes, such as utility racks, for solutions, these other racks are not faced with the same design constraints that encumber racks for IT and telecom equipment. Specifically, racks for IT and telecom equipment are located in a special room that is modified to provide appropriate electrical power and HVAC control (temperature, humidity, and/or particulate). Thus, as a business expands, this room can become very space constrained, as there is often a need to fit as many device chassis in one rack as possible. In addition, some open space must exist as telecommunications devices generate heat that must be able to be dissipated, or at a minimum, must not be directly conducted to neighboring devices. Therefore, shelving and direct staking approaches are not practical.

Traditional racks are also prone to being laterally flexible when telecommunications equipment chassis are not yet installed. Such flexibility makes installing IT and telecom equipment chassis into a rack difficult to accomplish, especially by only one person. Installed equipment actually increases the rigidity of the rack because the installed equipment acts as a lateral support between the vertical members.

BRIEF DESCRIPTION OF THE DRAWINGS

Certain features of the subject technology are set forth in the appended claims. However, the accompanying drawings, which are included to provide further understanding, illustrate disclosed aspects and together with the description serve to explain the principles of the subject technology. Understanding that these drawings depict only example embodiments of the disclosure and are not, therefore, to be considered to be limiting of its scope, the principles, herein, are described and explained with additional specificity and detail through the use of the accompanying drawings, in which:

FIG. 6 illustrates a detailed view of the rear of the chassis engaged with the rack mounting kit.

DETAILED DESCRIPTION

Figure 1:
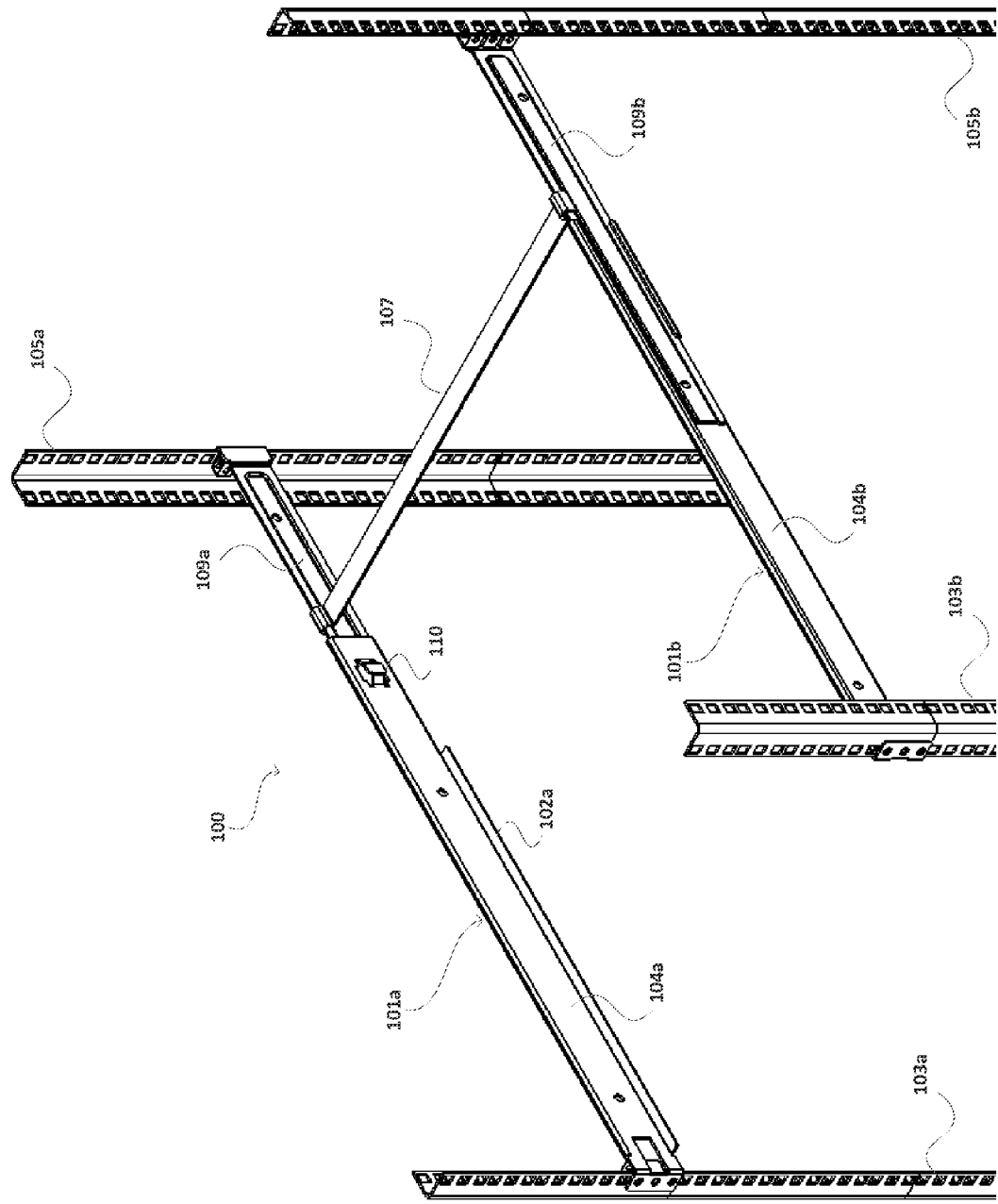
FIG. 1 is an example graphical projection of an rack mounting kit 100 mounted to a rack.

The detailed description set forth below is intended as a description of various configurations of the subject technology and is not intended to represent the only configurations in which the subject technology can be practiced. Additional features and advantages of the disclosure will be set forth in the description that follows, and in part will be obvious from the description, or can be learned by practice of the herein disclosed principles. The appended drawings are incorporated herein and constitute a part of the detailed description. The detailed description includes specific details for the purpose of providing a more thorough understanding of the subject technology. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Various embodiments of the disclosure are discussed in detail below. However, it will be clear and apparent that the subject technology is not limited to the specific details set forth herein and may be practiced without these details. While specific implementations are discussed, it should be understood that this is done for illustration purposes only. A person skilled in the relevant art will recognize that other components and configurations may be used without parting from the spirit and the scope of the disclosure. In some instances, structures and components may be shown in block diagram form in order to avoid obscuring the concepts of the subject technology.

Overview:

The disclosed technology includes an improved rack mounting kit which makes it practical for a single person to install an IT and telecom equipment chassis ("chassis"), such as a chassis for a switch, router, etc. In some embodiments, the present technology includes two complimentary brackets that each contain an edge or lip for the chassis to rest upon, like a partial shelf. In addition, a removable bracket can be installed to provide extra structure between the sides of the rack, in order to reduce lateral movement. Several possible embodiments of the present technology are disclosed herein. However, the described embodiments are not meant to be limiting, and persons of ordinary skill in the art will appreciate many potential variations that are within the level of skill in the art. Further, while aspects of the present technology will be described as embodiments, it will be appreciated that aspects of one embodiment are usable with other embodiments, and such is explicitly contemplated herein.

Description:

The present technology includes an improved rack mounting kit, which makes it practical for a single person to install a telecommunications equipment chassis (chassis), such as a chassis for a switch, router, server, etc. In some embodiments, the present technology includes two complimentary brackets that each contain an edge or lip for the chassis to rest upon, like a partial shelf. Additionally, a removable bracket can be installed to provide extra structure between the sides of the rack, to reduce lateral movement.

FIG. 1 illustrates a top perspective view of an example rack mounting kit 100. As illustrated in FIG. 1, the rack itself is made up of vertical members 103a, 103b, 105a, and 105b. 103a and 103b are located in the front of the rack. Vertical members 105a and 105b are located in the rear of the rack. Vertical members 103a and 105a are on the left side of the rack, when viewed from the front. Vertical members 103b and 105b are on the right side of the rack, when viewed from the front. The rack mounting kit includes horizontal members 101a, 101b, 109a, and 109b. Horizontal members 101a and 109a together make up one complimentary horizontal member joining vertical members 103a and 105a. Horizontal members 101b and 109b make up a complimentary horizontal member joining vertical members 103b and 105b. Cross brace 107 can temporarily stabilize the complimentary horizontal members during installation of a chassis, by improving parallelism.

The two sets of complimentary horizontal members (101a/109a and 101b/109b) are horizontally expandable to allow installation in multiple racks designs where the distance between the front and rear vertical members are within a specified range. In the example embodiment, the front horizontal members 101a and 101b are formed with U-channels at the top and bottom. The rear horizontal members 109a and 109b, in the example embodiment, are configured to slide inside of the U-channels formed by the respective complimentary front horizontal members 101a and 101b. The length of each complimentary horizontal member (101a/109a and 101b/109b) can be varied by sliding the rear horizontal member 109a or 109b away from the respective front horizontal member 101a or 101b.

Figure 4:
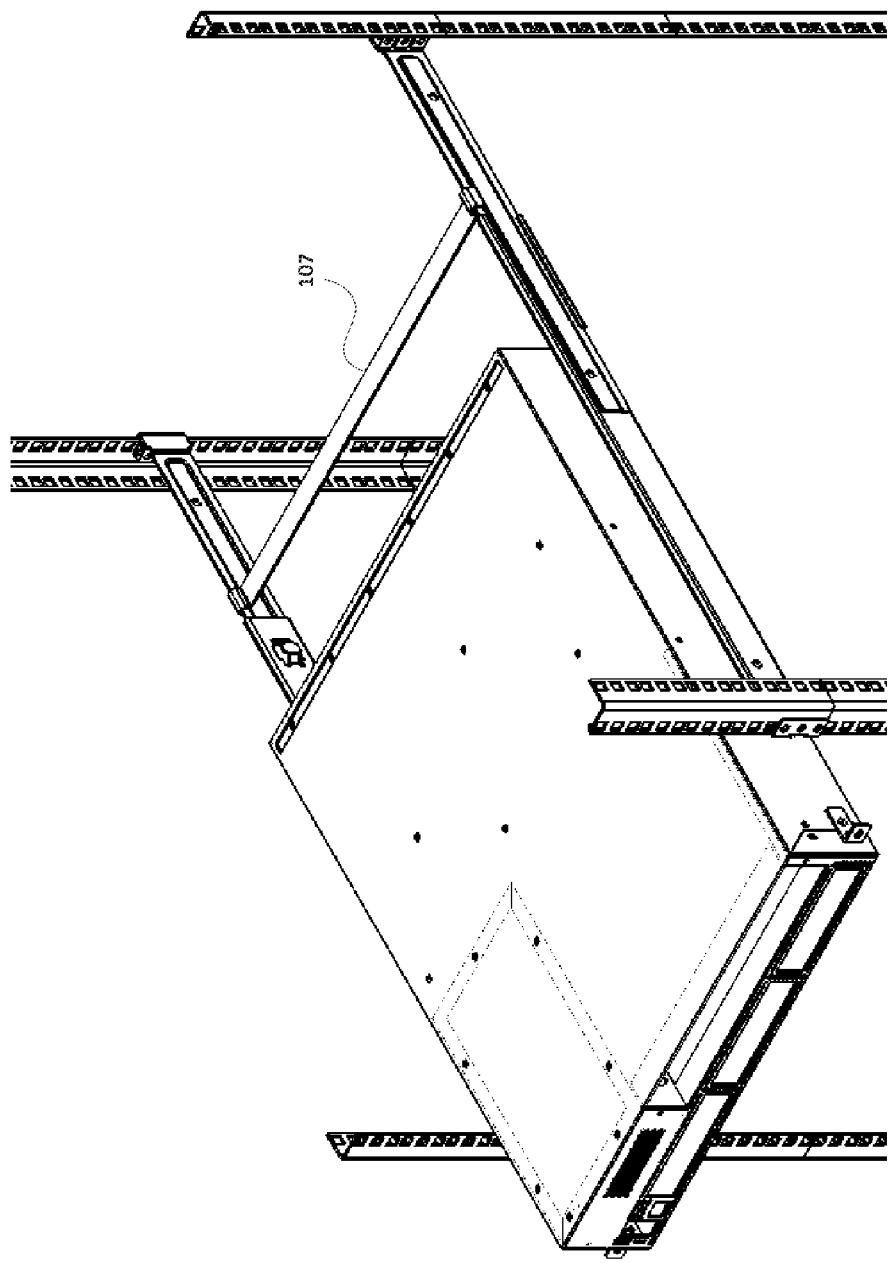
FIG. 4 illustrates an example rack mounting kit installed onto a rack with a chassis shown partially installed onto the rack mounting kit.
Figure 5:
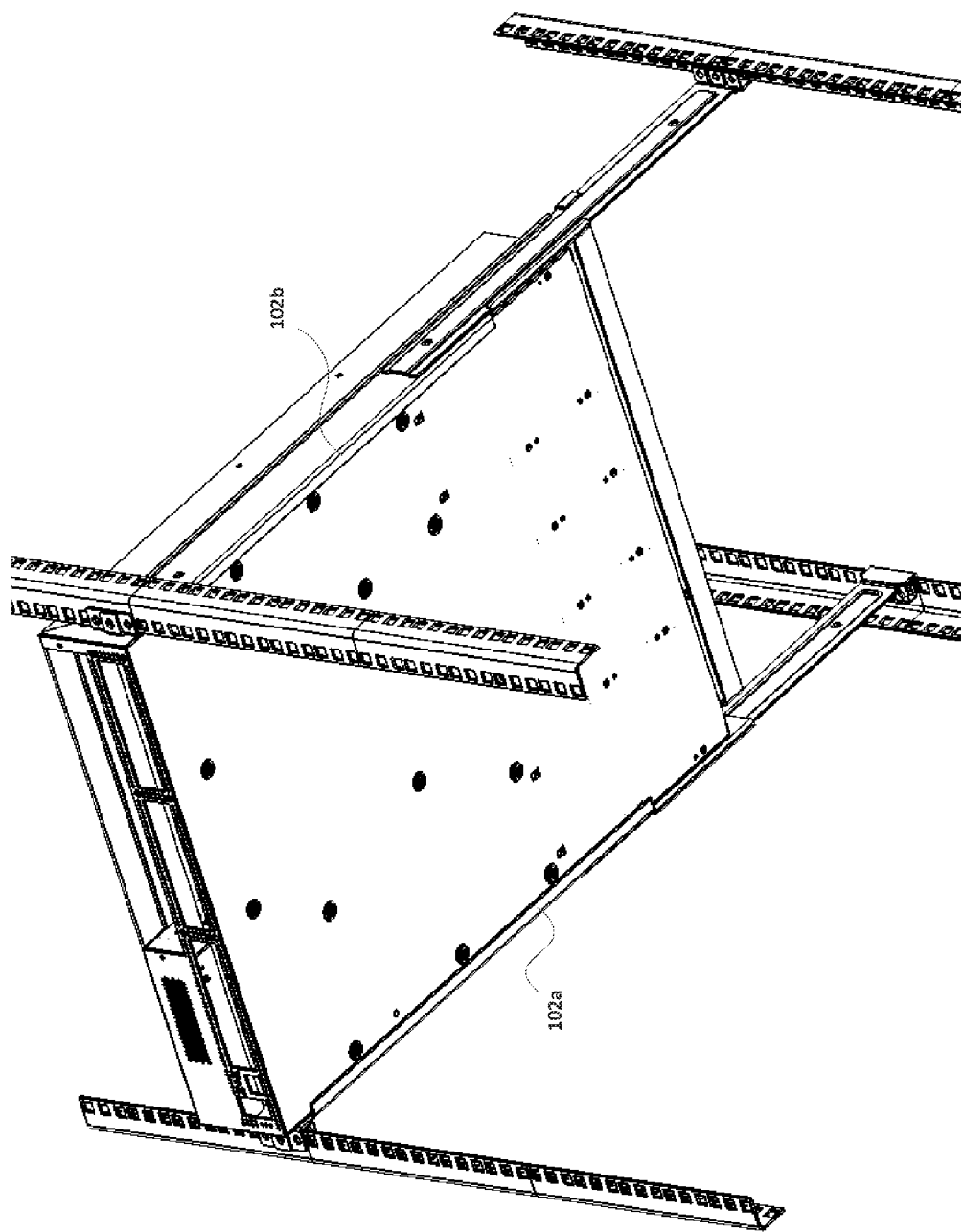
FIG. 5 illustrates an example rack mounting kit installed onto a rack with a chassis shown substantially installed onto the rack mounting kit.

Horizontal members 101a and 101b both include a side rail portion 104a and 104b, respectively, and lip portion 102a and 102b, respectively. (Lip portion 102b of horizontal member 101b is not shown in FIG. 1.) As illustrated in FIG. 4 and FIG. 5 lip portions 102a and 102b of complimentary horizontal members 101a and 101b, respectively, provide support to a chassis while being installed. Lip portions 102a and 102b are sized with a width of 0.1-5 inches. Preferably, the width of the lip portions 102a and 102b are sized between 0.25-2 inches. The length of the lip portions 102a and 102b are sized between 0.1-36 inches. Preferably the length of the lip portions 102a and 102b are between 12-24 inches. While the lip portions 102a and 102b are shown in FIG. 1 as being continuous, they may be non-continuous in the form of two or more segments positioned in the same plane along the horizontal members 101a and 101b, respectively.

Figure 6:
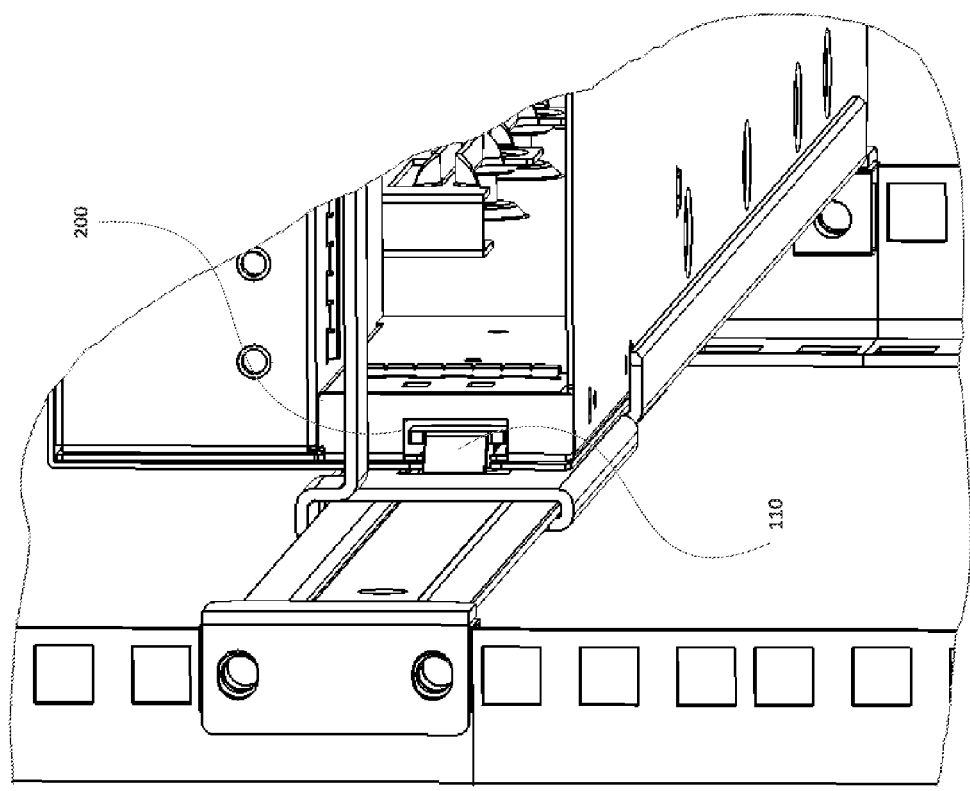
FIG. 6 is an example graphical projection of a base bracket.

Horizontal members 101a and 101b both include a male latch portion 110. (Latch portion of member 101b is not shown in FIG. 1). As illustrated in FIG. 6, latch 110 is configured to interface with a chassis and secure the chassis into place.

Figure 2:
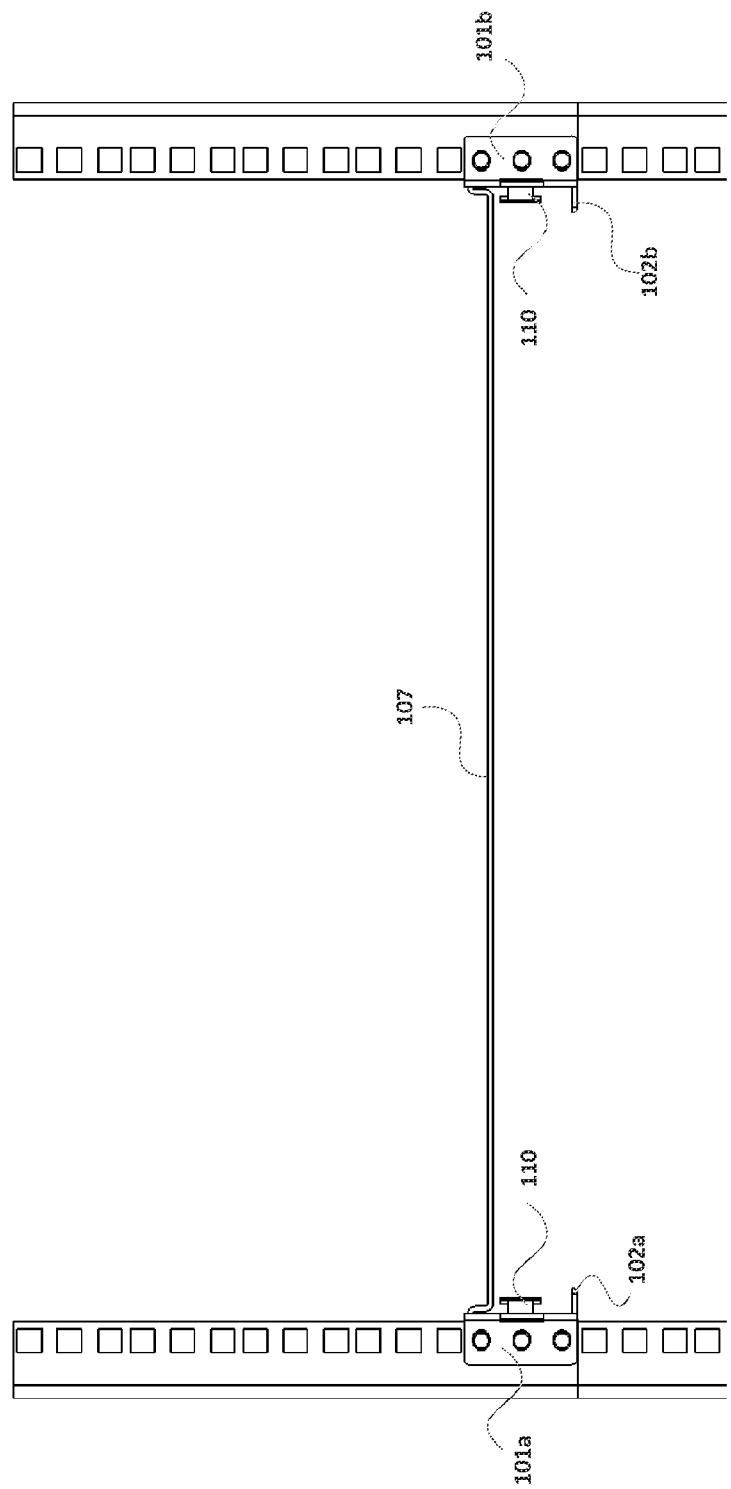
FIG. 2 illustrates a front view of an example rack mounting kit mounted to a rack.

FIG. 2 Illustrates a front view of an exemplary rack and rack mounting kit. As illustrated, horizontal members 101a and 101b interface with the rack via screws that secure the horizontal members 101a and 101b to vertical members 103a and 103b, respectively. Lip portions 102a and 102b are also visible protruding in a horizontal direction towards the center of the rack and form surfaces sufficient to rest an installed chassis thereon. Latch 110 can also be seen protruding towards the center of the rack and are configured to engage with an installed chassis. Cross brace 107 is also illustrated extending from one side of the rack to the other.

Figure 3:
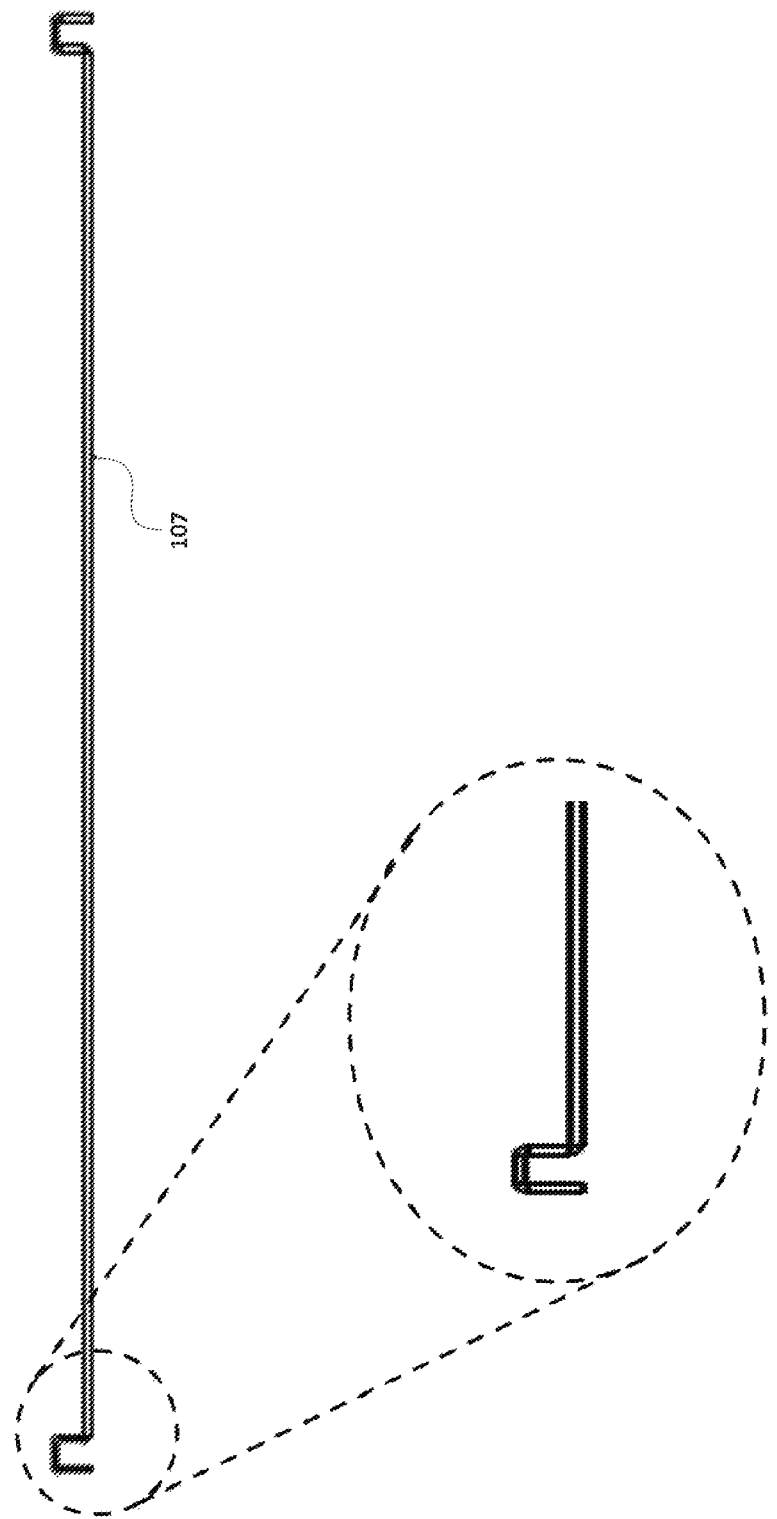
FIG. 3 is a front view of an isolated example cross brace 107, including an enlarged view of one of its ends.

FIG. 3 is an exemplary isolated view of cross brace 107, including an enlarged view of one of its ends. The end of the cross brace is configured to be a hanger that can rest on top of one of the horizontal members 101a, 101b, 109a, and 109b. In some embodiments, it is anticipated that the cross brace will interface with the portion of the horizontal members just behind the latch 110. In some embodiments, the cross brace rests upon the complimentary horizontal members and limits lateral movement of the horizontal members during chassis installation. After a chassis is installed, the cross brace can be removed and used in another installation procedure, as the installed chassis will provide increased lateral support. The exemplary embodiment shown in FIG. 3 utilizes ends that are shaped into a U-channel, as shown in the enlarged view. Other embodiments for these ends are considered, such as a V-groove or even a locking mechanism that secures the cross brace to the horizontal members, perhaps using a spring-loaded pin or threaded bolt/screw. The cross brace is intended to be easy to install and remove, but remain in place during chassis installation, such that it is not accidentally dislodged. The cross brace can be made from many different materials, including metals and polymers. The cross brace can be utilized as an installation-only tool when installing a chassis or it may be utilized in a permanent fashion.

The design of the cross brace may include stiffening features, such as ribs, gussets, and bosses, and may have a shape that increases bending stiffness, such as I-beam or curved cross-section.

FIG. 4 illustrated an exemplary chassis shown partially installed into the rack using the rack mounting kit of the present technology. While lip portions 102a and 102b are not shown, the chassis can rest on the complimentary lip portions while the chassis is slid into place. Cross brace 107 provides support to horizontal members to prevent them from bowing inward or flexing outward, ensuring the chassis does not slip between the lip portions and fall to whatever surface is below.

FIG. 5 illustrates an exemplary chassis in a substantially installed position, in which the chassis is being supported by lip portions 102a and 102b.

FIG. 6 illustrates a detailed view of male latch portion 110 interfacing with a complimentary female latch portion 200, defined within the chassis body. Collectively, latch portion 110 is configured to mate with latch portion 200 and acts as a stop to prevent the chassis from being pushed off the back of the rack. Latch portions 110 and 200 also secure the rear of the chassis to the horizontal members to prevent possible flexure of the horizontal members. When latch portions 110 and 200 are engaged with each other they provide the necessary lateral support and can render the cross brace redundant, such that it can be removed while the chassis is fully installed. The engagement between the two latch portions 110 and 200 may be passive or active, such as with a spring loaded retention mechanism retained in the rear of the chassis.

As will be appreciated by those of skill in the art the presently described technology allows an operator to freely support a chassis on complimentary lips that create a shelf-like feature as the operator affixes the chassis to the rack. The present technology makes alignment between the chassis and rack significantly easier, such that a chassis can be installed on a rack easily and safely by one person. The present technology does not require rollers or ball bearings for installation of a chassis. The bottom of the chassis contacts lip portions 102a and 102b, so when sliding the chassis onto the rack kit, the friction surface area is limited. Further, the complimentary horizontal members (101a/109a and 101b/109b) can be made from a strong material with a low coefficient of friction, such as steel, to allow the chassis to slide more easily during installation.

To install the present technology onto a four-vertical post rack, the following method may be used. With respective front and rear horizontal members already assembled, one front horizontal member can be attached to the rack. This is often done with two threaded screws. The complimentary rear horizontal member can then be slid out from the front horizontal member until it contacts the rear vertical member of the rack. This rear horizontal member can then be attached to the rack. Again, this is often done with two threaded screws. The same process is repeated with the front and rear horizontal member on the opposite side of the rack, wherein the complimentary horizontal members (101a/109a and 101b/109b) are parallel to each other. A cross brace may then be placed near the rear of the front horizontal members. It may be located behind the latches but ahead of the rear end of the front horizontal members. The hardware chassis is then lifted and placed onto the lip portions of the front horizontal members. The hardware chassis is slide toward the rear of the rack. The latches on the front horizontal members may then engage receptacles located on the rear and/or sides of the chassis. The front and/or sides of the chassis may contain a bracket, such that the front portion of the chassis can be secured to the rack. This is often done with a threaded screw on each side.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. A method of installing a chassis into a rack, the rack having four vertical members including a front left member, a back left member, a front right member and a back right member, and two expandable horizontal members including a right expandable horizontal member with a rear portion and a front portion, and a left expandable horizontal member with a rear portion and a front portion, the front portion of the left horizontal member being attached to the front left vertical member, the rear portion of the left horizontal member being attached to the back left vertical member, the front portion of the right horizontal member being attached to the front right vertical member, and the rear portion of the right horizontal member being attached to the back right vertical member, each of the two front portions of the horizontal members including a chassis support lip, wherein the front portion of each horizontal member defines a channel, the respective rear portion of each horizontal member being configured to slide within the channel, the method comprising:

installing a cross member on top of, and substantially perpendicular to the rear portion of the left expandable horizontal member and the rear portion of the right expandable horizontal member;

supporting a rear right corner and a rear left corner of a chassis on the chassis support lip of the front portions of the horizontal members, the horizontal members being made of a bendable material, whereby the cross member limits bowing of the horizontal members under the weight of the chassis.

2. The method of claim 1, wherein at least one of the front portions of the left and right expandable horizontal members includes a latch configured to engage the chassis.

3. The method of claim 2, further comprising:
sliding the chassis rearward along the chassis support lips of the expandable horizontal members so that the chassis is supported by the chassis support lips of the expandable horizontal members.

4. The method of claim 3, wherein sliding the chassis rearward continues until the latch engages the chassis, thereby continued rearward movement is prevented.

5. The method of claim 4, wherein the latch engagement with the chassis at least partially secures the chassis from sliding forward or backward.

6. The method of claim 5, further comprising:
after the chassis is supported by the chassis support lip of the right and left expandable horizontal members, removing the cross member.

7. An apparatus for adding lateral stiffness to a hardware equipment rack comprising:
a rack having two expandable horizontal members including:
a right expandable horizontal member with a rear portion and a front portion, and
a left expandable horizontal member with a rear portion and a front portion,
wherein each the two front portions of the horizontal members include a chassis support lip, wherein the front portion of each of the right expandable horizontal member and the left expandable horizontal member defines a channel, the respective rear portion of each expandable horizontal member being configured to slide within the respective channel; and
a cross member with a lengthy mid-section and two ends, wherein the ends are attached to the rear portions of the two expandable horizontal members, whereby the member is able to be removed from the rear portions of the horizontal members without additional tools.

8. The apparatus of claim 7, wherein the cross member is composed of metal.

9. The apparatus of claim 7, wherein the cross member is composed of a polymeric material.

10. The apparatus of claim 7, wherein the chassis support lip is configured to support a chassis and at least one of the front portions includes a latch configured to engage the chassis.

11. The apparatus of claim 10, wherein the latch is further configured to engage the chassis are configured to support a chassis:
sliding the chassis rearward along the chassis support lips of the expandable horizontal members so that the chassis is supported by the chassis support lip of the expandable horizontal members.

12. The apparatus of claim 11, wherein the cross member is configured to be removed after the chassis is engaged by the latch.

13. A system comprising:
a rack including:
- four vertical members including a front left member, a back left member, a front right member and a back right member; and
- two expandable horizontal members including a right expandable horizontal member with a rear portion and a front portion, and a left expandable horizontal member with a rear portion and a front portion, the front portion of the left horizontal member being attached to the front left vertical member, the rear portion of the left horizontal member being attached to the back left vertical member, the front portion of the right horizontal member being attached to the front right vertical member, and the rear portion of the right horizontal member being attached to the back right vertical member, each the two front portions of the horizontal members including a chassis support lip, each of the two rear portions of the horizontal members not including a chassis support lip, wherein the front portion of each horizontal member defines a channel, the respective rear portion of each horizontal member being configured to slide within the channel; and
- a cross member with a lengthy mid-section and two ends; wherein the cross member is configured to be installed on top of, and substantially perpendicular to the rear portion of the left expandable horizontal member and the rear portion of the right expandable horizontal member to limit bowing of the horizontal members under the weight of the chassis.

14. The system of claim 13, wherein the rack is configured to support a rear right corner and a rear left corner of a chassis on the chassis support lip of the front portions of the horizontal members, respectively.

15. The system of claim 14, wherein at least one of the front portions of the left and right expandable horizontal members includes a latch configured to engage a chassis.

16. The system of claim 14, wherein the latch is configured to, upon engagement with the chassis, at least partially secure the chassis from sliding forward or backward.

17. The system of claim 16, wherein the cross member is further configured to be installed before the chassis is placed on the chassis support lip and removed after the latch engages the chassis.

\* \* \* \* \*